(12) United States Patent
Nakagaki

(10) Patent No.: US 10,424,555 B2
(45) Date of Patent: Sep. 24, 2019

(54) MOUNTING COMPONENT, SEMICONDUCTOR DEVICE USING SAME, AND MANUFACTURING METHOD THEREOF

(71) Applicant: NICHIA CORPORATION, Anan-shi, Tokushima (JP)

(72) Inventor: Masatoshi Nakagaki, Komatsushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 16/018,829

(22) Filed: Jun. 26, 2018

(65) Prior Publication Data

US 2019/0006310 A1 Jan. 3, 2019

(30) Foreign Application Priority Data

Jun. 29, 2017 (JP) .................. 2017-127296

(51) Int. Cl.
| | |
|---|---|
| *H01L 23/14* | (2006.01) |
| *H01L 23/00* | (2006.01) |
| *H01L 23/538* | (2006.01) |
| *H01S 5/02* | (2006.01) |
| *H01L 21/52* | (2006.01) |
| *H01L 23/544* | (2006.01) |

(Continued)

(52) U.S. Cl.
CPC .............. *H01L 24/31* (2013.01); *H01L 21/52* (2013.01); *H01L 23/142* (2013.01); *H01L 23/5383* (2013.01); *H01L 23/544* (2013.01); *H01S 5/0206* (2013.01); *H01S 5/02268* (2013.01); *H01L 23/3735* (2013.01); *H01L 2223/54426* (2013.01); *H01L 2223/54486* (2013.01); *H01L 2224/0603* (2013.01); *H01L 2224/48247* (2013.01); *H01L 2224/49113* (2013.01); *H01L 2224/49175* (2013.01); *H01S 5/02212* (2013.01); *H01S 5/02276* (2013.01); *H01S 5/02469* (2013.01)

(58) Field of Classification Search
CPC ... H01L 21/52; H01L 23/142; H01L 23/5383; H01L 24/31
See application file for complete search history.

(56) References Cited

U.S. PATENT DOCUMENTS 4,890,157 A * 12/1989 Wilson ................ H01L 21/4846
257/668
5,768,109 A * 6/1998 Gulick .................... H01L 23/13
174/255

(Continued)

FOREIGN PATENT DOCUMENTS

| JP | H06-160676 A | 6/1994 |
|---|---|---|
| JP | H8-83955 A | 3/1996 |

(Continued)

*Primary Examiner* — Allan R Wilson
(74) *Attorney, Agent, or Firm* — Global IP Counselors, LLP

(57) ABSTRACT

A mounting component includes a main body and a metal layer. The main body has a first main surface and a second main surface. The metal layer is arranged on the first main surface of the main body. The metal layer includes at least one concave recognition mark having an inclined surface that is inclined with respect to a main surface of the metal layer.

19 Claims, 8 Drawing Sheets

(51) Int. Cl.
*H01S 5/022* (2006.01)
*H01L 23/373* (2006.01)
*H01S 5/024* (2006.01)

(56) References Cited

U.S. PATENT DOCUMENTS

| | | | |
|---|---|---|---|
| 6,344,148 | B1 | 2/2002 | Park et al. |
| 6,455,944 | B1 | 9/2002 | Kato et al. |
| 6,872,630 | B1 * | 3/2005 | Chen ................... G03F 9/708 |
| | | | 257/E23.179 |
| 9,209,596 | B1 * | 12/2015 | McLaurin ........... H01L 29/2003 |
| 2001/0040240 | A1 | 11/2001 | Tatoh |
| 2005/0236721 | A1 * | 10/2005 | Yen .................... G03F 7/70633 |
| | | | 257/797 |
| 2009/0001555 | A1 * | 1/2009 | Ando ................. H01L 23/3675 |
| | | | 257/708 |
| 2010/0025681 | A1 * | 2/2010 | Katoh ................ G02F 1/13452 |
| | | | 257/48 |
| 2012/0164313 | A1 | 6/2012 | Shibata et al. |

FOREIGN PATENT DOCUMENTS

| | | |
|---|---|---|
| JP | 2000-147308 A | 5/2000 |
| JP | 2001-196607 A | 7/2001 |
| JP | 2002-014259 A | 1/2002 |
| JP | 2003-318215 A | 11/2003 |
| JP | 2005-093804 A | 4/2005 |
| JP | 2006-041382 A | 2/2006 |
| JP | 2008-294086 A | 12/2008 |
| JP | 2012-133171 A | 7/2012 |
| JP | 2013-038311 A | 2/2013 |

* cited by examiner

MOUNTING COMPONENT, SEMICONDUCTOR DEVICE USING SAME, AND MANUFACTURING METHOD THEREOF

CROSS-REFERENCE TO RELATED APPLICATIONS

This application claims priority to Japanese Patent Application No. 2017-127296 filed on Jun. 29, 2017. The entire disclosure of Japanese Patent Application No. 2017-127296 is hereby incorporated herein by reference.

TECHNICAL FIELD

The present disclosure relates to a mounting component, a semiconductor device using same, and manufacturing method the semiconductor device.

BACKGROUND ART

A submount described in Japanese Laid-Open Patent Publication No. 2005-093804, for example, is known as a submount for mounting a semiconductor laser element. In the submount disclosed in the abovementioned Japanese Laid-Open patent publication, a metal electrode is formed on the surface thereof, and a marker for positioning a semiconductor laser element is formed on a part of this. The shape of the marker is one that will be recognized by the edge of the metal electrode.

SUMMARY

In the light emitting device of the abovementioned Japanese Laid-Open Patent Publication, however, when a marker is detected by utilizing the contrast produced by the difference in the light reflectance on the inside and outside of the edge of the metal electrode as described in the abovementioned patent literature, detection can be difficult if the contrast is not high enough. For example, the contrast between the inside and outside of the edge is low when a separate metal layer apart from the metal electrode is provided inside and outside the edge of the metal electrode, or when there is little difference in the light reflectance between the main body of the submount and the metal electrode.

An embodiment of the present invention includes the following constitution.

A mounting component according to one embodiment includes: a main body having a first main surface and a second main surface; and a metal layer arranged on the first main surface, the metal layer including at least one concave recognition mark having an inclined surface that is inclined with respect to a main surface of the metal layer.

A semiconductor device according to one embodiment includes: the mounting component according to the above, and a semiconductor element mounted on the mounting component.

A method for manufacturing a semiconductor device according to one embodiment includes: preparing the mounting component according to the above, determining a mounting position of the semiconductor element using the at least one concave recognition mark, and fixing the semiconductor element at the mounting position of the mounting component.

In light of that, the purpose of an embodiment of the present invention is to provide a mounting component, a semiconductor device using same, or manufacturing method of the semiconductor device.

With the mounting component of one embodiment of the present invention, it is possible to obtain the mounting component having the recognition mark that can be detected accurately without relying on the contrast between the metal layer and other members. Also, with the semiconductor device and the manufacturing method in which such mounting component is used, it is possible to allow accurate mounting of a semiconductor element using the recognition mark.

DETAILED DESCRIPTION OF EMBODIMENTS

Figure 1A:
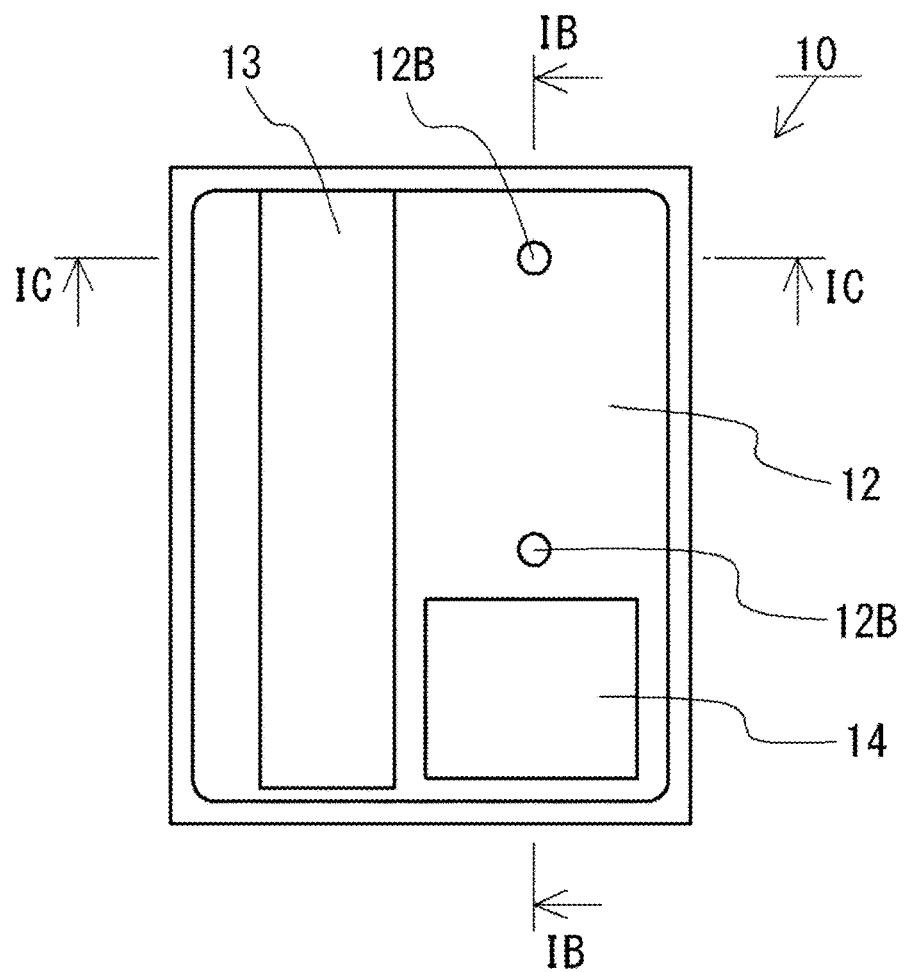
FIG. 1A is a schematic plan view of a mounting component according to an embodiment of the present invention.

Hereafter, embodiments of the present invention are explained while referring to the drawings as appropriate. However, the mounting component, the light emitting device and the manufacturing method thereof explained hereafter is for embodying the technical concept of the present invention, and unless specifically noted, the present invention is not limited to the following. Also, the size, positional relationship, etc., of the members shown in the drawings may sometimes be exaggerated to clarify the explanation. Furthermore, in the descriptions below, the same name or reference numeral represents the same member or a member made of the same material, and its detailed description will be omitted as appropriate.

Figure 1B:
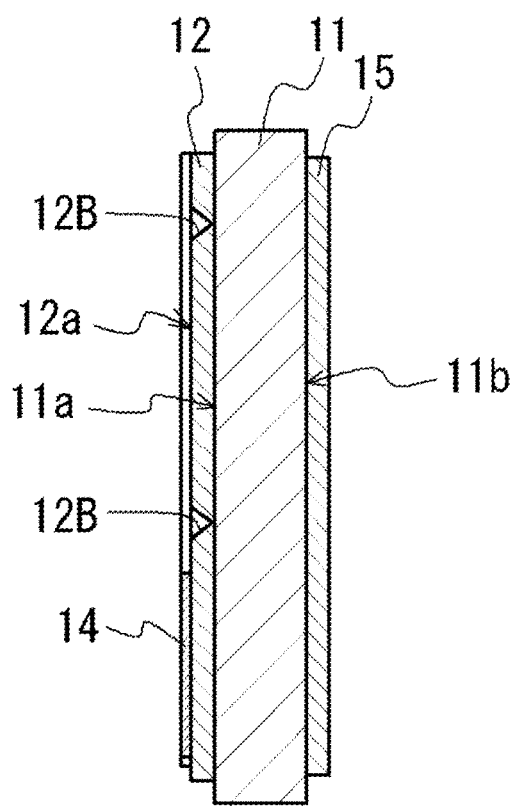
FIG. 1B is a schematic cross section view of the mounting component as taken along a line IB-IB in FIG. 1A.
Figure 1C:
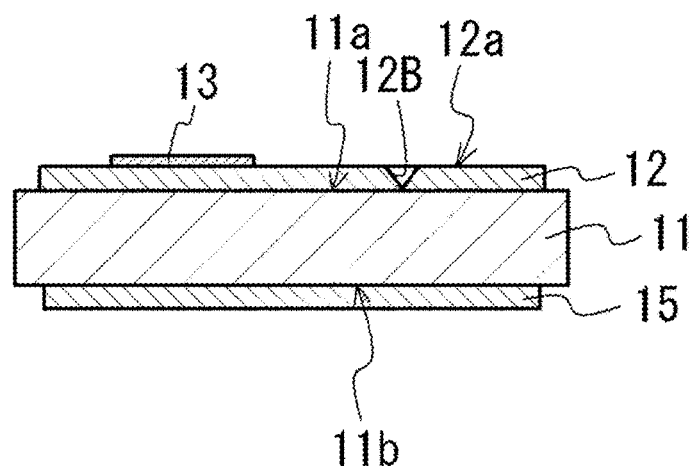
FIG. 1C is a schematic cross section view of the mounting component as taken along a line IC-IC line in FIG. 1A.
Figure 1D:
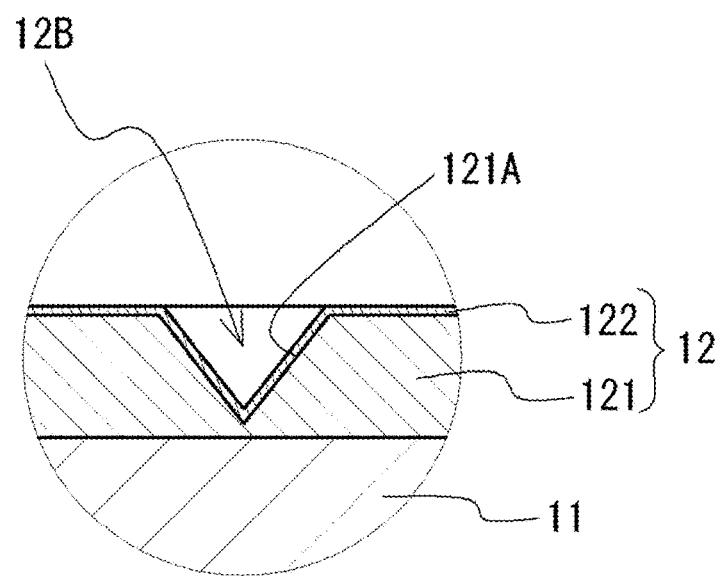
FIG. 1D is an enlarged detail view of a recognition mark illustrated in FIG. 1C.

FIG. 1A is a schematic plan view of a mounting component 10 according to an embodiment of the present invention; FIG. 1B is a schematic cross section view of the mounting component as taken along a line IB-IB in FIG. 1A; FIG. 1C is a schematic cross section view of the mounting component as taken along a line IC-IC line in FIG. 1A; FIG. 1D is an enlarged detail view of a recognition mark illustrated in FIG. 1C. As shown in FIGS. 1A to 1D, the mounting component 10 has a main body 11 having a first main surface 11a and a second main surface 11b, and a metal layer 12 provided on the first main surface 11a. At least one concave recognition mark 12B having an inclined surface that is inclined with respect to the main surface 12a of the metal layer 12 is provided to the metal layer 12.

Since the recognition mark 12B has an inclined surface, the direction in which it reflects light differs from that of the main surface 12a. For example, observing from a direction perpendicular to the main surface 12a, when light is emitted from the same direction, since the metal layer 12 reflects the light, the main surface 12a mainly reflects light in the observation direction, giving the light a bright color. On the other hand, the inclined surface of the recognition mark 12B looks darker in color because it reflects light in a different direction. Consequently, the recognition mark 12B can be accurately detected without relying on the contrast between the metal layer 12 and some other member.

Figure 2:
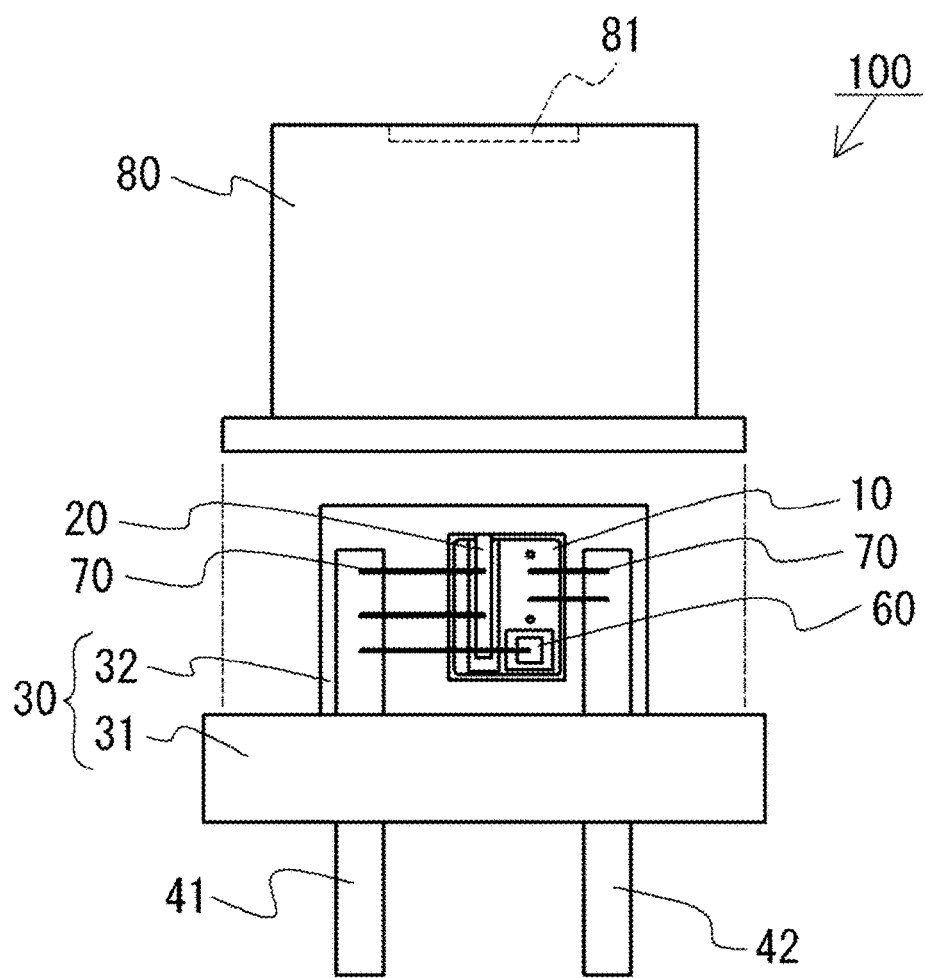
FIG. 2 is a schematic exploded view of a semiconductor device according to an embodiment of the present invention.

A semiconductor element can be mounted on this mounting component 10. FIG. 2 is a schematic exploded view of the semiconductor device 100 according to an embodiment. As shown in FIG. 2, the semiconductor device 100 has a mounting component 10 and a semiconductor element 20 that is mounted on the mounting component 10. As mentioned above, since the recognition mark 12B provided to the mounting component 10 can be accurately detected, it is possible to obtain the semiconductor device 100 on which the semiconductor element 20 is accurately mounted by using this recognition mark 12B.

Main Body 11

The main body 11 has a first main surface 11a and a second main surface 11b. The first main surface 11a side is the side on which the semiconductor element 20 is mounted. It is preferable to use a member with high thermal conductivity for the main body 11 so that heat from the mounted semiconductor element 20 can be efficiently dispersed to the outside. More specifically, it is preferable to use AlN, CuW, diamond, SiC, a ceramic, or the like for the mounting component 10. Also, it is preferable for the main body 11 to be a member whose difference in coefficient of thermal expansion from the semiconductor element 20 is less than that of a package body 30 (discussed below). This reduces the likelihood that the semiconductor element 20 will separate from the mounting component 10 due to the difference in thermal expansion coefficients.

Metal Layer 12

The metal layer 12 is provided to the first main surface 11a. At least part of the region of the mounting component 10 in which the metal layer 12 is provided can serve as the mounting region in which the semiconductor element 20 is mounted in plan view. In this specification, "in plan view" means observing from a direction perpendicular to the first main surface 11a. The thickness of the metal layer 12 is 10 µm or more, and preferably 30 µm or more. This facilitates formation of the recognition mark 12B in the metal layer 12. Also, the manufacturing cost rises in proportion to the thickness of the metal layer 12, so the thickness of the metal layer 12 is preferably 100 µm or less.

Recognition Mark 12B

The concave recognition mark 12B is provided to the metal layer 12. As shown in FIGS. 1B and 1C, the recognition mark 12B is preferably an inverted conical recess. In the case where the recognition mark 12B is shaped as, for example, a truncated cone having a bottom surface as well as the inclined surface, the plan view shape of the inclined surface will be, for example a ring shape formed by concentric circles surrounding the bottom surface. In this case, the object to be detected has such a linear ring shape, but the width of the line can vary depending on the inclination of the inclined surface and the depth of the recess. On the other hand, with an inverted conical shape, the inclined surface defines the recess as a whole, so the plan view shape is not affected by the inclination angle of the inclined surface, etc., as much as with a truncated conical shape. This allows for more reliable detection when the recognition mark 12B is detected by comparing the actually formed recognition mark 12B with an image of a recognition mark that has been previously registered.

The recognition mark 12B having an inclined surface can be easily formed by wet etching. Since wet etching tends to be isotropic etching, it is preferable for the shape of the recognition mark 12B in plan view to be rounded so as to facilitate formation by wet etching. The plan view shape of the recognition mark 12B may be elliptical, circular, or a compound shape thereof. The recognition mark 12B shown in FIG. 1A has a circular shape when viewed from the first main surface 11a side. When the recognition mark 12B is formed by wet etching, if the etching is performed until the metal layer 12 is completely shaved off at the position where the recognition mark 12B is formed, side etching proceeds and reduces the surface area of the inclined surface in plan view too much. Such an excessive progress of side etching can be suppressed by keeping the depth of the recognition mark 12B at less than the thickness of the metal layer 12, so an inclined surface can be formed that can be recognized in plan view.

Figure 4:
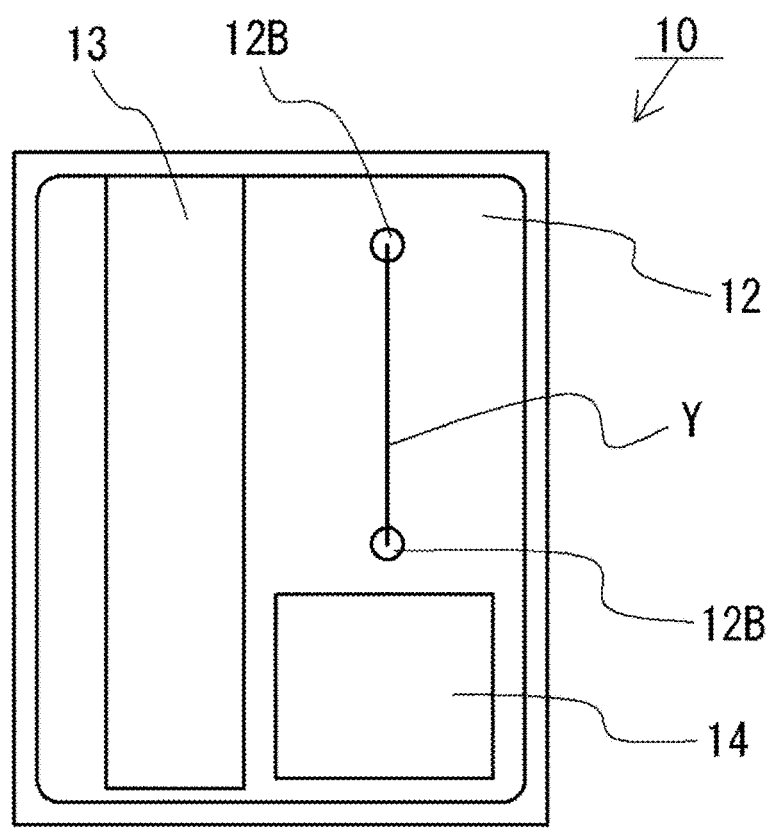
FIG. 4 is a schematic diagram for explaining one of the manufacturing steps for manufacturing the semiconductor device according to an embodiment of the present invention.

As shown in FIG. 1A, the metal layer 12 preferably has a plurality of recognition marks 12B. As a result, as shown in FIG. 4 (discussed below), the semiconductor element 20 and the like can be positioned by using an imaginary line Y connecting the recognition marks 12B as a reference. Particularly when the recognition marks 12B are formed by wet etching, it is difficult to make the outer edges of the recognition marks 12B linear, so it is preferable to use this imaginary line Y to specify the x direction or the y direction of the mounting component 10. Also, in the case where the semiconductor element 20 is a semiconductor laser element, an imaginary line Y connecting a plurality of recognition marks 12B is preferably disposed parallel to the resonator direction (the direction in which the waveguide region extends) of the mounted semiconductor laser element. This makes it easy to match the angle between the mounting component and the resonator direction of the semiconductor element 20. Since a semiconductor laser device is generally designed so that the resonator direction is the longitudinal direction, the mounting component 10 can be made more compact in the case where the longitudinal direction of the semiconductor laser device coincides with the longitudinal direction of the imaginary line Y. Accordingly, it is preferable to dispose the recognition marks 12B so that the imaginary line Y is parallel to the longitudinal direction of the mounting component 10.

The recognition mark 12B is made large enough to be detectable by image recognition or the like. More specifically, it is preferable for the surface area of the plan view shape of the recognition mark 12B to be at least 50 µm². Also, in the case where the shape of the recognition mark 12B is circular in plan view, it is preferable for the diameter to be at least 10 µm. On the other hand, in the case where the recognition mark 12B is formed in the shape of an inverted cone by wet etching, the maximum width of the recognition mark 12B in plan view is preferably less than the thickness of the metal layer 12. In the case where the shape of the recognition mark 12B is circular in plan view, its diameter is preferably less than the thickness of the metal layer 12.

First Metal Layer 121, Second Metal Layer 122

As shown in FIG. 1D, the metal layer 12 has, starting from the main body portion 31 side, a first metal layer 121 consisting of a single layer and provided with at least one recess 121A, and a second metal layer 122 consisting of one or more layers and being thinner than the first metal layer 121. In this case, it is preferable for the recognition mark 12B to be formed by covering the recess 121A with the second metal layer 122. In the case where the metal layer 12 has a multilayer structure and the recess is formed after the multilayer structure, the inclined surface of the recess will tend not to be flat, and there will tend to be unevenness in appearance of the recognition mark 12B in plan view. With the recognition mark 12B shown in FIG. 1D, since the concave portion 121A is formed in the thick first metal layer 121, irregularities are less likely to occur on the inclined surface of the recognition mark 12B, so there tends to be less unevenness in plan view.

Figure 1E:
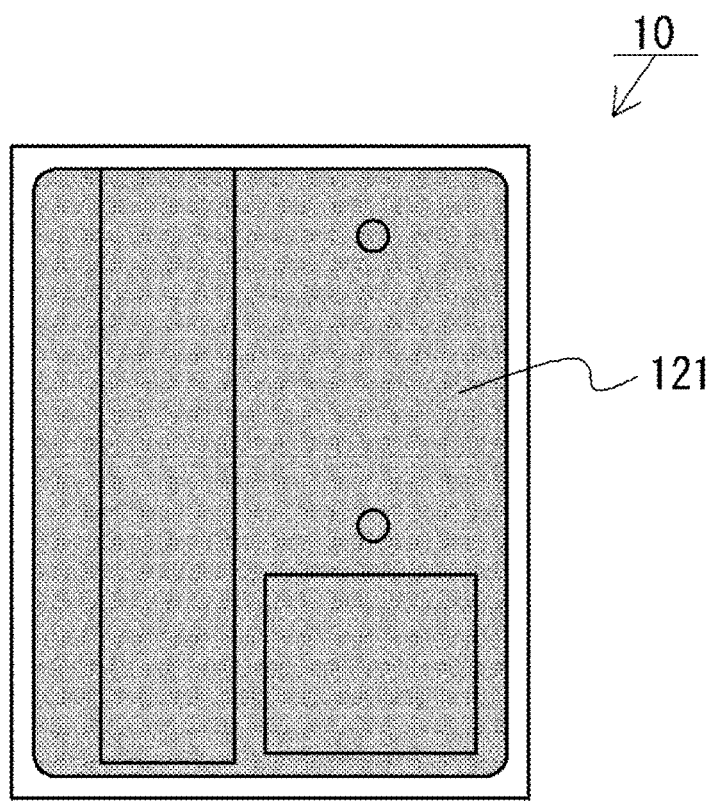
FIG. 1E is a diagram showing a region where a first metal layer is provided in the mounting component.
Figure 1F:
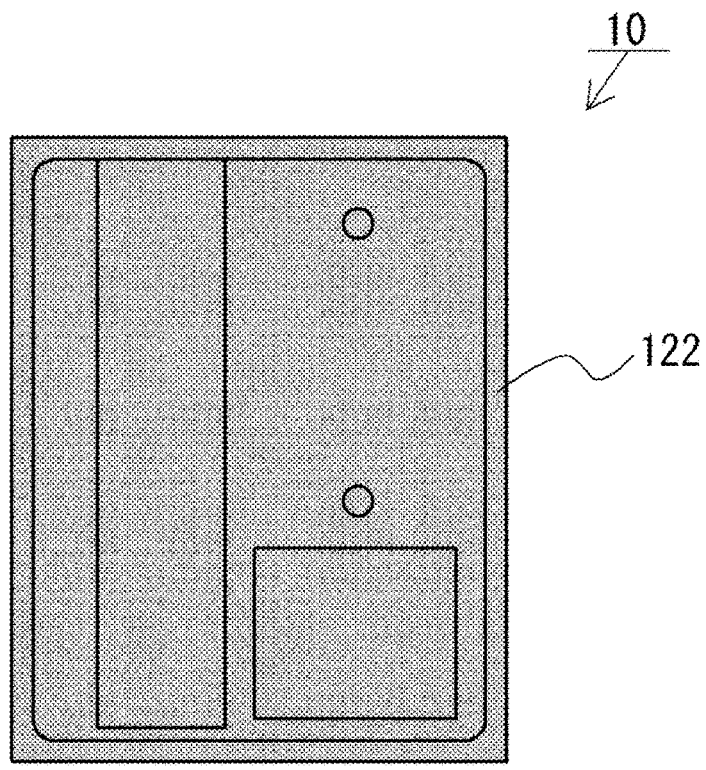
FIG. 1F is a diagram showing a region where a second metal layer is provided in the mounting component.

The grayed region in FIG. 1E is the region where the first metal layer 121 is provided, and the grayed region in FIG. 1F is the region where the second metal layer 122 is provided. The first metal layer 121 is preferably provided away from at least a part of the outer edge of the first main surface 11a. This is because the mounting component 10 is cut out from a wafer-shaped substrate by dicing, for example, but there is the risk that burrs may be produced when the thick first metal layer 121 is located at the position where dicing or the like is performed. Furthermore, as shown in FIG. 1E, the first metal layer 121 is preferably provided away from all of the outer edges of the first main surface 11a.

The first metal layer 121 is made thick enough to allow the recess 121A to be formed in a detectable size. An example of the thickness of the first metal layer 121 is 10 μm or more, and preferably 30 μm or more. Also, since the manufacturing cost increases in proportion to the thickness of the first metal layer 121, the thickness of the first metal layer 121 is preferably no more than 100 μm. The preferable shape of the recess 121A is the same as that of the recognition mark 12B. As to the size of the recess 121A, the same range as for the recognition mark 12B can be employed. Just as with the recognition mark 12B, it is preferable for the recess 1121A to be formed by wet etching.

The first metal layer 121 can be a copper layer. Consequently, heat dissipation can be improved when at least part of the region where the first metal layer 121 is provided in plan view is the mounting region where the semiconductor element 20 and the like are mounted. In order to reduce the possibility of separation of the mounting component 10 from the package body 30 due to a difference in the coefficients of thermal expansion between the main body 11 and the package body 30 (discussed below), a rear metal layer 15 is provided on the second main surface 11b side. In the case where the package body 30 may be mainly composed of copper, for example, providing a copper layer as the rear metal layer 15 makes these thermal expansion coefficients equal to each other, so separation can be less likely to occur.

As shown in FIG. 1F, the second metal layer 122 preferably covers substantially the entire first metal layer 121 and the entire portion of the first main surface 11a exposed from the first metal layer 121. As described above, contrast can be produced between the inside and outside of the recognition mark 12B without changing the material, so the second metal layer 122 can be provided without patterning. This also reduces the cost. Also, in the case where the first metal layer 121 is a copper layer, it is difficult to provide a first conductive member 13 and a second conductive member 14 directly on the surface of the copper layer, so it is preferable to provide the second metal layer 122 between these. In this case, the second metal layer 122 can reliably cover all the way to the outer edge of the first metal layer 121 by providing the second metal layer 122 without patterning. Consequently, the first conductive member 13 can also be reliably provided all the way to the outer edge of the first metal layer 121, so the end surface of the semiconductor element 20 is easily positioned near the outer edge of the mounting component 10. This configuration is particularly preferable when a semiconductor laser device (discussed below) is mounted junction down.

An example of the thickness of the second metal layer 122 is 0.2 μm or more. Also, the second metal layer 122 is preferably thin enough to suppress burrs from being produced when the substrate is divided up by dicing or the like. The thickness of the second metal layer 122 is preferably 2 μm or less, and more preferably 1 μm or less. The phrase "covers substantially the entire . . . " here means that the second metal layer 122 is provided without being patterned, and this concept encompasses when a portion is missing due to dicing, for example.

As will be described below, a metal wire 70, for example, is bonded to the surface of the metal layer 12. Accordingly, the outermost surface of the second metal layer 122 is preferably a layer of gold. Also, in the case where the outermost surface is a gold layer, this will improve adhesion between the first conductive member 13 and the second conductive member 14. An example of the second metal layer 122 is a structure in which titanium, platinum and gold are stacked in that order starting from the first metal layer 121 side.

First Conductive Member 13, Second Conductive Member 14

As shown in FIGS. 1A to 1C, the first conductive member 13 can be provided on the surface of the metal layer 12. The first conductive member 13 is a bonding material for bonding the semiconductor element 20. The second conductive member 14 may be further provided on the surface of the metal layer 12. A protective element 60, for example, can be bonded to the second conductive member 14. Conductive member that can be bonded to the semiconductor element 20 or the like can be selected as the material of the first conductive member 13 and the second conductive member 14, an example of which is an AuSn alloy. The first conductive member 13 and the second conductive member 14 may have not just a bonding layer, but also a cover layer or other layers, and can have a stacked structure of Pt/AuSn/Au, for example. The thickness of the first conductive member 13 and the second conductive member 14 is, for example, about 2 to 5 μm each.

Semiconductor Device 100

FIG. 2 show one embodiment of a semiconductor device 100. The semiconductor device 100 has the package body 30 and a cap 80. The package body 30 has, for example, a base 31 and a heat sink 32. Lead terminals 41 and 42 are inserted into through-holes made in the base 31, one of which is an anode and the other is a cathode. The mounting component 10 is fixed to the heat sink 32. Also, the semiconductor element 20 is bonded to the first conductive member 13 of the mounting component 10, and the protective element 60 is bonded to the second conductive member 14. These members and the lead terminals 41 and 42 are electrically connected by a plurality of metal wires 70. The cap 80 is fixed to the base portion 31 by welding or the like so that the semiconductor element 20 and the protective element 60 are disposed in the sealed space surrounded by the cap 80 and the base 31.

Base 31

The base 31 is preferably made from a material with relatively high thermal conductivity, such as a material of about 20 W/mK or more, so that the heat generated by the semiconductor element 20 can be efficiently released to the outside. More specifically, examples include metals such as copper, aluminum, iron, nickel, molybdenum, Cu W, and CuMo, and copper is used here, for example. The base 31 can be a flat member having a main surface that is circular, elliptical, rectangular or some other polygonal shape, or a shape similar to these. For example, a circular, flat member having a diameter of about 3 to 10 mm can be used as the base 31.

The same material as that used for the base 31 may be used for the heat sink 32, or a different material may be used. For example, an iron alloy for welding the cap 80 can be used as the material of the base 31, and copper or a copper alloy having good heat dissipation can be used as the material of the heat sink 32. This allows the heat from the semiconductor element 20 in the heat sink 32 to be effectively dissipated. At least part of the heat sink 32 is disposed above the base 31. The base 31 and the heat sink 32 may be separate members or may be parts of a single member. A bonding material such as an AuSn alloy or a solder paste material can be used to fix the mounting component 10 to the heat sink 32. A bonding material containing metal nanoparticles or metal submicron particles and an organic solvent may also be used.

Lead Terminals 41 and 42

The lead terminals 41 and 42 are members for electrically connecting the semiconductor element 20 to an external power supply. A conductive material is used for the lead terminals 41 and 42. The lead terminals 41 and 42 are rod-shaped members composed of metal, for example. The lead terminals 41 and 42 are disposed, for example, so as to pass through holes made in the base 31, and are bonded to the base 31 with glass or the like.

Semiconductor Element 20

The semiconductor element 20 is bonded to the first conductive member 13. The semiconductor element 20 is, for example, a light emitting element, and preferably a semiconductor laser element. A semiconductor laser element needs to have better mounting accuracy than a light emitting diode (LED), but the semiconductor element 20 can be mounted very accurately by using the above-mentioned recognition mark 12B. Also, since it can be mounted so accurately, the semiconductor element 20 is preferably mounted junction-down to the mourning component 10. When junction down mounting is used for the semiconductor laser element (the semiconductor element 20), it is preferable if either the light emitting end surface of the semiconductor element 20 coincides with the end surface of the mounting component 10 in plan view, or the light emitting end surface protrudes outward somewhat, so that the main part of the emitted laser beam will not hit the mounting component 10. On the other hand, it is preferable for the amount of protrusion amount to be small so that heat generated at the light emitting end surface and the vicinity thereof can be dissipated to the mounting component 10 side. Using the recognition mark 12B to mount the semiconductor element 20 more accurately makes it possible to strike a good balance between these.

A semiconductor of compounds from groups III to V can be used as the semiconductor element 20. For example, a semiconductor laser device having a semiconductor-stack composed of a nitride semiconductor such as InGaN, GaN, or the like is used. The semiconductor element 20 has, for example, a semiconductor stack including an n-type semiconductor layer, an active layer, and a p-type semiconductor layer on a conductive or insulating substrate, and further has an n electrode that is electrically connected to the n-type semiconductor layer, and a p electrode electrically connected to the p-type semiconductor layer.

Protective Element 60

The protective element 60 is bonded to the second conductive member 14. The protective element 60 is a member for protecting the semiconductor element 20 from electrical breakdown due to a surge current. A Zener diode can be used for the protective element 60, for example.

Metal Wire 70

The metal wire 70 is a linear member made of metal, and a material such as gold or silver having a diameter of about 10 to 100 μm can be used.

The cap 80 can, for example, be made of a material such as nickel, cobalt, iron, an Ni—Fe alloy, KOVAR®, brass, or the like. The cap 80 can be bonded to the base 31 by resistance welding or the like. The semiconductor element 20 is preferably hermetically sealed by bonding the cap 80 to the base 31. This reduces the collection of dust on the semiconductor element 20 due to laser oscillation. When the semiconductor element 20 is a light emitting element, as shown in FIG. 2, it has a window 81 through which light from the semiconductor element 20 is transmitted. The window 81 can be formed of a translucent member such as glass, sapphire, or a ceramic.

Method for Manufacturing Semiconductor Device 100

Figure 3:
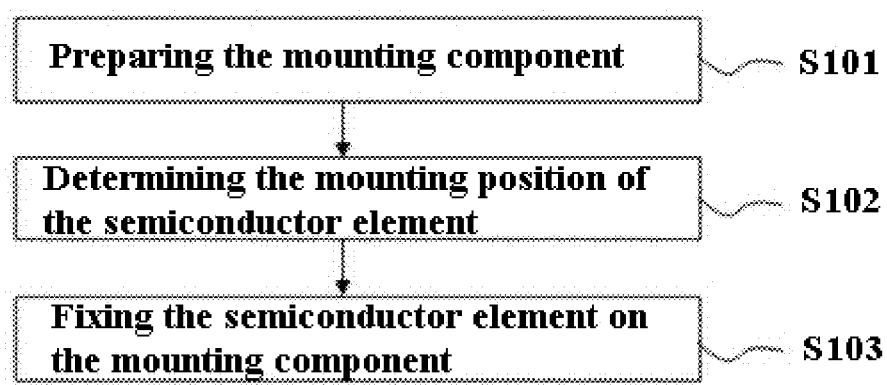
FIG. 3 is a flowchart showing the manufacturing steps for manufacturing the semiconductor device according to an embodiment of the present invention.

As shown in FIG. 3, the method for manufacturing the semiconductor device 100 includes a step S101 of preparing the mounting component 10, a step S102 of determining the mounting position of the semiconductor element 20 using the recognition mark 12B, and a step S103 of fixing the semiconductor element 20 at the mounting position of the mounting component 10. This allows the semiconductor element 20 to be mounted accurately on the mounting component 10. In step S102 of determining the mounting position of the semiconductor element 20, an example of the illumination used for detecting the recognition mark 12B is epi-illumination which irradiates from the same direction as the observation direction. The light from this illumination is emitted in a direction perpendicular to the main surface 12a of the metal layer 12, for example. Also, the protective element 60 may be mounted by the same method as the semiconductor element 20.

As shown in FIG. 4, when the mounting component 10 has at least two recognition marks 12B, in step S102 of determining the mounting position of the semiconductor element 20, it is preferable to determine the mounting position by using a line (imaginary line Y) connecting the centers of the recognition marks 12B as a reference. There will be less deviation from the target shape when the centers in plan view shape are used as a reference than when the outer edges of the recognition mark 12B are used as a reference, so the semiconductor element 20 can be mounted more accurately. Also, as described above, if the recognition mark 12B is formed by wet etching, the outer edge of the recognition mark 12B may not be linear, so it is preferable to use the imaginary line Y to specify the x direction or the y direction of the mounting component 10.

What is claimed is:

1. A mounting component comprising:
a main body having a first main surface and a second main surface; and
a metal layer arranged on the first main surface of the main body, the metal layer including at least one concave recognition mark having an inclined surface that is inclined with respect to a main surface of the metal layer, a part of a region where the metal layer is arranged on the main body in plan view being a mounting region on which a semiconductor element is to be mounted.

2. The mounting component according to claim 1, wherein
the at least one concave recognition mark is an inverted conical recess.

3. The mounting component according to claim 1, wherein
the metal layer includes
a first metal layer consisting of a single layer, and defining at least one recess, and
a second metal layer that is thinner than the first metal layer, and including one or more layers, and
the at least one concave recognition mark has a configuration in which the second metal layer covers the at least one recess of the first metal layer.

4. The mounting component according to claim 3, wherein
the first metal layer is spaced apart from at least a part of an outer edge of the first main surface of the main body.

5. The mounting component according to claim 4, wherein
the first metal layer is a copper layer.

6. The mounting component according to claim 4, wherein
the second metal layer covers substantially an entire upper surface of the first metal layer and substantially an entire portion of the first main surface of the main body exposed from the first metal layer.

7. The mounting component according to claim 1, wherein
the at least one concave recognition mark has a circular shape when viewed from a first main surface side of the main body.

8. The mounting component according to claim 1, wherein
the metal layer has a plurality of concave recognition marks including the at least one concave recognition mark.

9. The mounting component according to claim 1, wherein
the main body is made of AlN, CuW, diamond, SiC, or a ceramic.

10. A semiconductor device comprising:
a mounting component including
a main body having a first main surface and a second main surface, and
a metal layer arranged on the first main surface of the main body, the metal layer including at least one concave recognition mark having an inclined surface that is inclined with respect to a main surface of the metal layer; and
a semiconductor element mounted on the mounting component in a part of a region where the metal layer is arranged on the main body in plan view.

11. The semiconductor device according to claim 10, wherein
the semiconductor element is a semiconductor laser element.

12. The semiconductor device according to claim 11, wherein
the semiconductor element is mounted junction-down to the mounting component.

13. The semiconductor device according to claim 11, wherein
the semiconductor element has a nitride semiconductor stack.

14. The semiconductor device according to claim 10, wherein
the metal layer includes
a first metal layer consisting of a single layer, and defining at least one recess, and
a second metal layer thinner than the first metal layer, and
including one or more layers, and
the at least one concave recognition mark has a configuration in which the second metal layer covers the at least one recess of the first metal layer.

15. The semiconductor device according to claim 14, wherein
the first metal layer is spaced apart from at least a part of an outer edge of the first main surface of the main body.

16. The semiconductor device according to claim 14, wherein
the first metal layer is a copper layer.

17. The semiconductor device according to claim 14, wherein
the second metal layer covers substantially an entire upper surface of the first metal layer and substantially an entire portion of the first main surface of the main body exposed from the first metal layer.

18. A method for manufacturing a semiconductor device comprising:
preparing a mounting component including
a main body having a first main surface and a second main surface, and
a metal layer arranged on the first main surface of the main body, the metal layer including at least one concave recognition mark having an inclined surface that is inclined with respect to a main surface of the metal layer;
determining a mounting position of a semiconductor element in a part of a region where the metal layer is arranged on the main body in plan view using the at least one concave recognition mark; and
fixing the semiconductor element at the mounting position of the mounting component in the part of the region where the metal layer is arranged on the main body in plan view.

19. The method for manufacturing a semiconductor device according to claim 18, wherein
the preparing of the mounting component includes preparing the mounting component including the metal layer having at least two concave recognition marks including the at least one concave recognition mark, and the determining of the mounting position of the semiconductor element includes determining the mounting position of the semiconductor element by using a line connecting centers of the at least two concave recognition marks as a reference.

\* \* \* \* \*